(12) United States Patent
Hiraishi et al.

(10) Patent No.: US 8,988,952 B2
(45) Date of Patent: Mar. 24, 2015

(54) SEMICONDUCTOR DEVICE HAVING ODT FUNCTION

(71) Applicant: PS4 Luxco S.a.r.l., Luxembourg (LU)

(72) Inventors: Atsushi Hiraishi, Tokyo (JP); Toshio Sugano, Tokyo (JP); Seiji Narui, Tokyo (JP); Yasuhiro Takai, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 264 days.

(21) Appl. No.: 13/727,389

(22) Filed: Dec. 26, 2012

(65) Prior Publication Data
US 2013/0163353 A1 Jun. 27, 2013

(30) Foreign Application Priority Data

Dec. 26, 2011 (JP) ................................. 2011-284154

(51) Int. Cl.
*G11C 7/00* (2006.01)
*G11C 7/22* (2006.01)
*G11C 7/10* (2006.01)

(52) U.S. Cl.
CPC .............. *G11C 7/222* (2013.01); *G11C 7/1057* (2013.01); *G11C 7/1066* (2013.01)
USPC ............................... 365/193; 365/63; 365/194

(58) Field of Classification Search
USPC ............................................. 365/193, 194, 63
See application file for complete search history.

(56) References Cited

U.S. PATENT DOCUMENTS 7,038,486 B2 * 5/2006 Aoyama et al. ................. 326/30
7,457,176 B2 * 11/2008 Dono ............................ 365/193
8,198,915 B2 * 6/2012 Yoko ............................. 326/56
8,243,488 B2 * 8/2012 Harashima et al. ............. 365/51

FOREIGN PATENT DOCUMENTS

JP 2008-210307 A 9/2008

* cited by examiner

*Primary Examiner* — Son Dinh

(57) ABSTRACT

Disclosed herein is a device that includes: a data strobe terminal; a data terminal; a first output driver coupled to the data strobe terminal; a second output driver coupled to the data terminal; and a data control circuit configured to enable the first and second output drivers to function as termination resistors in different timings from each other.

20 Claims, 13 Drawing Sheets

SEMICONDUCTOR DEVICE HAVING ODT FUNCTION

BACKGROUND OF THE INVENTION

1. Field of the Invention

The present invention relates to a semiconductor device, and more particularly relates to a semiconductor device that enables output drivers to function as termination resistors.

2. Description of Related Art

Conventional memory modules have termination resistors including discrete components mounted on a module substrate to suppress reflection of signals. However, a semiconductor device having an ODT (On Die Termination) function that causes output drivers to function as termination resistors is recently used to reduce the number of components or dynamically change values of termination resistance. For example, in a semiconductor device described in Japanese Patent Application Laid-open No. 2008-210307, an output driver connected to a DQ pin and an output driver connected to a DQS pin function as termination resistors when a control signal ODTON is activated.

However, during a write operation of a semiconductor device, a controller device does not always output a data signal DQ and a data strobe signal DQS to the semiconductor device at the same timing and, for example, an output timing of the data signal DQ is sometimes delayed by a predetermined time from an output timing of the data strobe signal DQS. In this case, if output impedances of output drivers are changed at the same time as in the Japanese Patent Application Laid-open No. 2008-210307, resistance values of the termination resistors may be changed during a burst input of the data signal DQ, which prevents a correct write operation. To solve this problem, it suffices to control the resistance values of the termination resistors to be kept until the burst input of the data signal DQ ends. In this case, however, start of the next write operation or read operation has to be delayed and access efficiency is decreased.

SUMMARY

In one embodiment, there is provided a device that includes: a data strobe terminal; a data terminal; a first output driver coupled to the data strobe terminal; a second output driver coupled to the data terminal; and a data control circuit configured to enable the first and second output drivers to function as termination resistors in different timings from each other in response to a predetermined command.

In another embodiment, there is provided a device that includes: a data strobe terminal; a data terminal; a first output driver coupled to the data strobe terminal; a first input receiver coupled to the data strobe terminal; a second output driver coupled to the data terminal; and a second input receiver coupled to the data terminal. The second input receiver is activated after a predetermined delay time has passed since an external data strobe signal is supplied to the first input receiver through the data strobe terminal. An output impedance of the second output driver changes from a first value to a second value after the predetermined delay time has passed since an output impedance of the first output driver changes from the first value to the second value.

In still another embodiment, such a device is provided that includes: a first selection circuit receiving first information and second information and outputting a selected one of the first and second information in response to a first selection signal; a delay circuit delaying the first selection signal to produce a second selection signal; a second selection circuit receiving third information and fourth information and outputting a selected one of the third and fourth information in response to the second selection signal; a first circuit responding to the selected one of the first and second information; and a second circuit responding to the selected one of the first and second information.

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
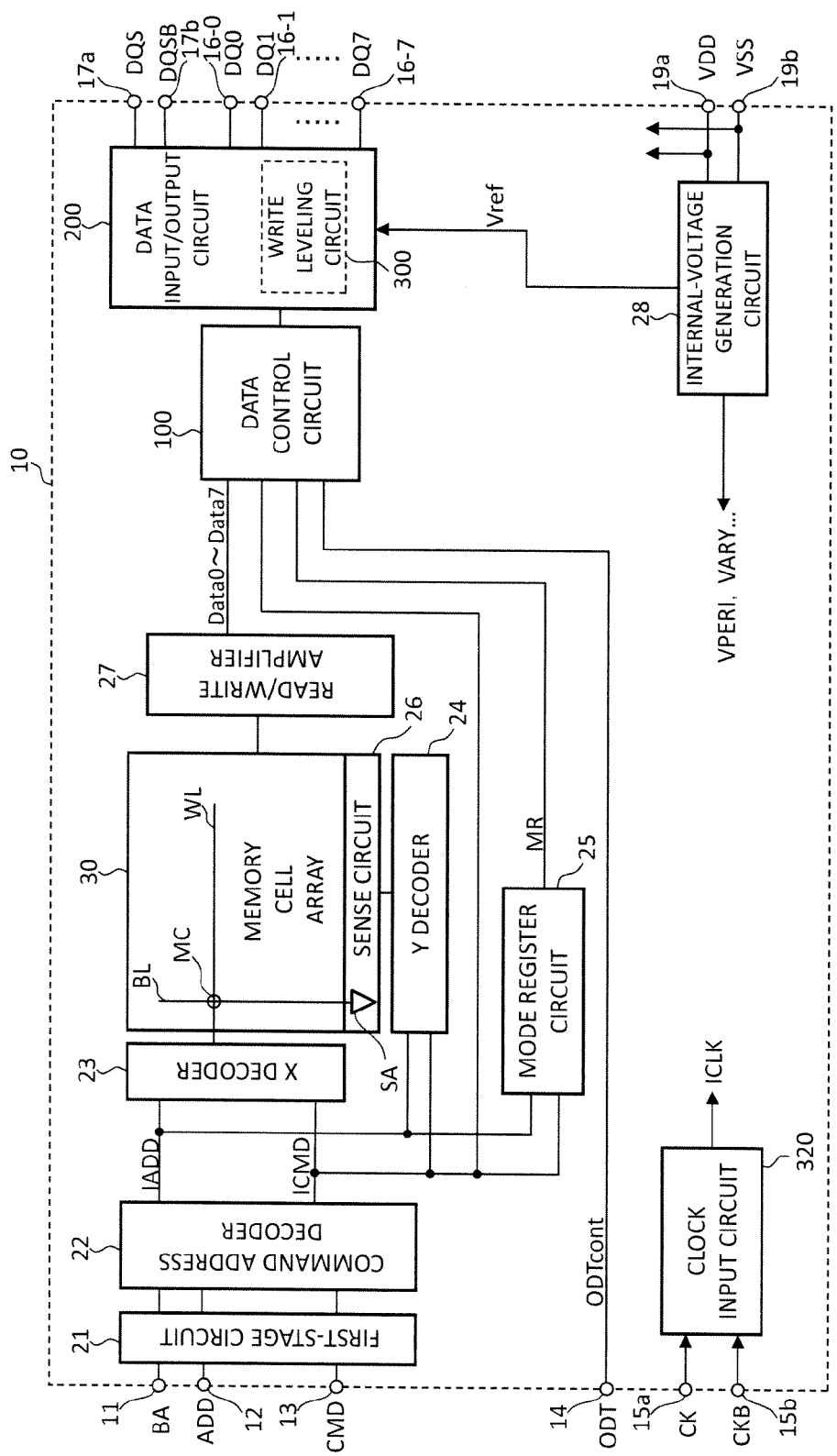
FIG. 1 is a block diagram showing a configuration of a semiconductor device according to a first embodiment of the present invention.

Referring now to FIG. 1, the semiconductor device 10 according to the first embodiment of the present invention is a DRAM (Dynamic Random Access Memory) integrated on single silicon chip. The semiconductor device 10 has a plurality of external terminals including a bank address terminal 11, an address terminal 12, a command terminal 13, an ODT terminal 14, clock terminals 15a and 15b, data terminals 16-0 to 16-7, data strobe terminals 17a and 17b, and power supply terminals 19a and 19b as shown in FIG. 1.

The bank address terminal 11, the address terminal 12, and the command terminal 13 are supplied with a bank address signal BA, an address signal ADD, and a command signal CMD, respectively. These signals BA, ADD and CMD are supplied to a command address decoder 22 via a first-stage circuit 21. The command address decoder 22 generates an internal address signal IADD and an internal command signal ICMD based on the signals BA, ADD and CMD. The internal address signal IADD and an internal command signal ICMD are supplied to an X decoder 23, a Y decoder 24, and a mode register circuit 25.

Specifically, when the command signal CMD indicates a row access, the internal command signal ICMD activates the X decoder 23. The X decoder 23 selects one of word lines WL included in a memory cell array 30 based on the internal address signal IADD generated from the bank address signal BA and the address signal ADD. When one of word lines WL is selected, a plurality of memory cells MC corresponding the selected word line WL are connected to corresponding bit lines BL. The data on the bit lines BL are amplified and held by sense amplifiers SA. In the memory cell array 30, a plurality of word lines WL and a plurality of bit lines BL intersect with each other and a memory cell MC is placed at each of intersections thereof. Note that only one word line WL, one bit line BL, and one memory cell MC are shown in FIG. 1. The bit lines BL are connected to corresponding sense amplifiers SA included in a sense circuit 26.

When the command signal CMD indicates a column access, the internal command signal ICMD activates the Y decoder 24. The Y decoder 24 selects one of the sense amplifiers SA included in the sense circuit 26 based on the internal address signal IADD generated from the bank address signal BA and the address signal ADD. The sense amplifier SA selected by the Y decoder 24 is connected to a read/write amplifier 27. In a read operation, the read/write amplifier 27 further amplifies internal read data Data0 to Data7 held by the sense circuit 26 and supplies the amplified read data to a data control circuit 100. In a write operation, the read/write amplifier 27 amplifies internal write data Data0 to Data7 supplied from the data control circuit 100 and supplies the amplified write data to the sense circuit 26. As shown in FIG. 1, the internal command signal ICMD, a set value MR, and an ODT control command ODTcont are also supplied to the data control circuit 100. The ODT control command ODTcont is supplied through the ODT terminal 14. Details of the data control circuit 100 are explained later.

Furthermore, when the command signal CMD indicates mode register set, the internal command signal ICMD activates the mode register circuit 25. Accordingly, a set value of the mode register circuit 25 can be overwritten by using the internal address signal IADD. Among set values of the mode register circuit 25, the set value MR related to data input/output operation is supplied to the data control circuit 100.

The clock terminals 15a and 15b are supplied with external clock signals CK and CKB, respectively. The external clock signals CK and CKB are supplied to a clock input circuit 320 and converted into an internal clock signal ICLK by the clock input circuit 320. The internal clock signal ICLK is used as a timing signal for specifying operation timings of various circuit blocks that constitute the semiconductor device 10, such as the X decoder 23, the Y decoder 24, and the data control circuit 100.

The data terminals 16-0 to 16-7 are terminals from which read data DQ0 to DQ7 are output or to which write data DQ0 to DQ7 are input, respectively. The data strobe terminals 17a and 17b are terminals to/from which external data strobe signals DQS and DQSB are input/output, respectively. These terminals 16-0 to 16-7, 17a, and 17b are connected to a data input/output circuit 200. The data input/output circuit 200 serves to output the read data DQ0 to DQ7 based on the internal read data Data0 to Data7 supplied via the data control circuit 100 in a read operation and to receive the write data DQ0 to DQ7 supplied from outside and supply the write data to the data control circuit 100 in a write operation. Details of the data input/output circuit 200 are explained later. The data input/output circuit 200 includes a write leveling circuit 300, which is explained in the second embodiment of the present invention.

The power supply terminals 19a and 19b are supplied with a power supply potential VDD and a ground potential VSS, respectively. These potentials are supplied to various circuit blocks including an internal-voltage generation circuit 28. The internal-voltage generation circuit 28 generates internal potentials VPERI, VARY, Vref, and the like. The internal potential VPERI is an operation potential used in many circuit blocks, such as the command address decoder 22 and the data control circuit 100. The internal potential VARY is an operation potential mainly used in the sense circuit 26. The reference potential Vref is a reference voltage used in input receivers included in the data input/output circuit 200, which is explained later.

Figure 2:
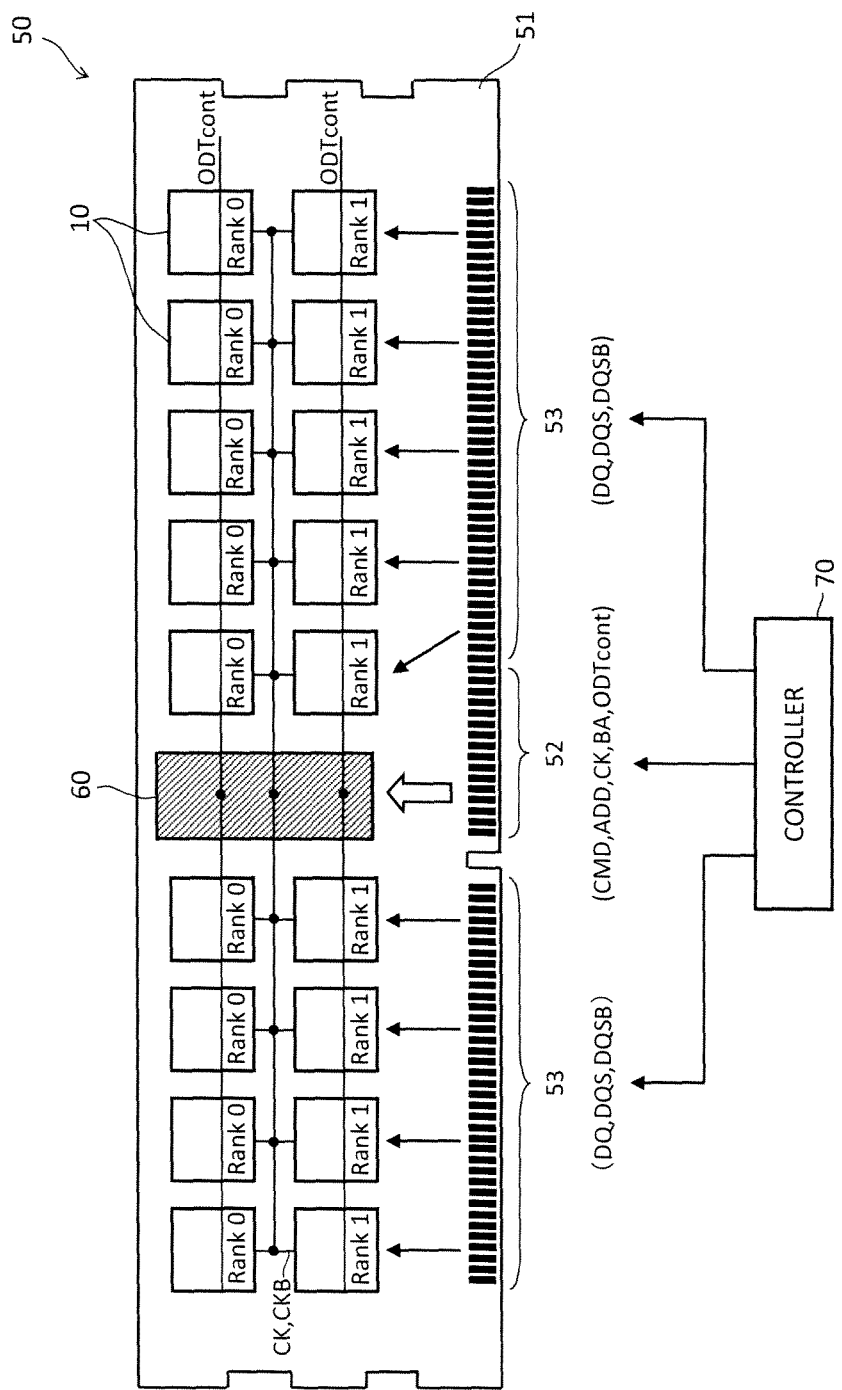
FIG. 2 is a schematic diagram showing a configuration of a memory module using the semiconductor device shown in FIG. 1.

Turning to FIG. 2, the memory module 50 has a configuration in which a plurality of the semiconductor devices 10 and one register buffer 60 are mounted on a surface of a module substrate 51. In FIG. 2, eighteen semiconductor devices 10 are mounted on the module substrate 51. The register buffer 60 receives the bank address signal BA, the address signal ADD, the command signal CMD, the external clock signals CK and CKB, and the ODT control command ODTcont that are supplied from a memory controller 70 via a command address connector 52 provided on the module substrate 51. The register buffer 60 buffers these signals and supplies the buffered signals commonly to each of the semiconductor devices 10. However, a chip select signal (CS) included in the command signal CMD is separately supplied to nine of the semiconductor devices 10 belonging to a rank 0 and to nine of the semiconductor devices 10 belonging to a rank 1. Accordingly, the nine semiconductor devices 10 belonging to the rank 0 and the nine semiconductor devices 10 belonging to the rank 1 are mutually exclusively activated. Similarly, the ODT control command ODTcont is supplied to each rank via the register buffer 60.

Meanwhile, a data connector 53 provided on the module substrate 51 is connected separately to the nine semiconductor devices 10 belonging to each rank. Connection between the ranks is common. The data connector 53 is connected to the data terminals 16-0 and 16-7 and the data strobe terminals 17a and 17b, which enables the nine semiconductor devices 10 belonging to one of the ranks selected by the chip select signal (CS) to output read data or input write data in parallel.

Figure 3:
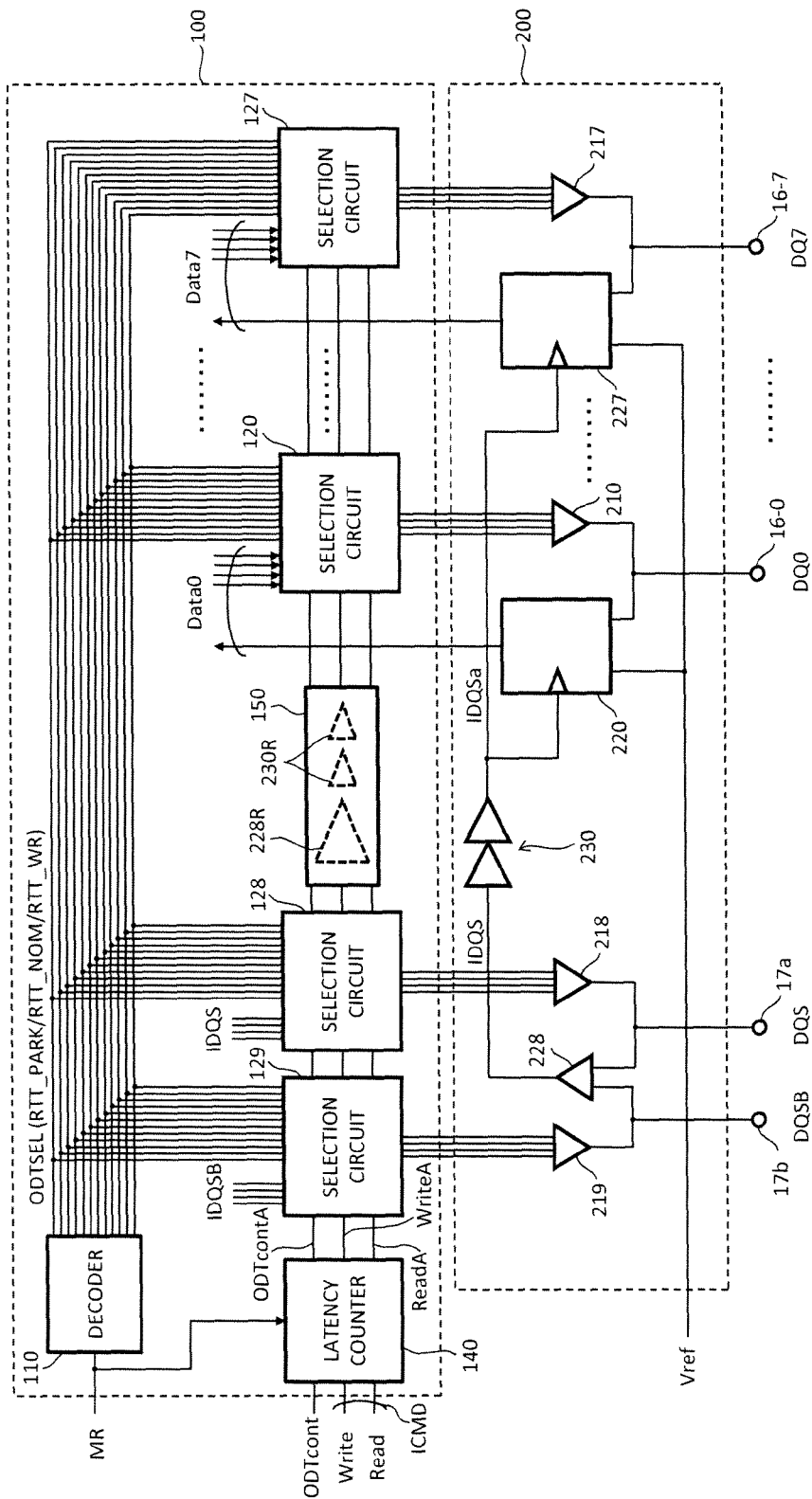
FIG. 3 is a circuit diagram showing a configuration of main parts of the data control circuit and the data input/output circuit shown in FIG. 1.

Turning to FIG. 3, the data control circuit 100 includes a decoder 110 that decodes the set value MR of the mode register circuit 25 to generate an ODT select signal ODTSEL. The data control circuit 100 further includes a plurality of selection circuits 120 to 129 that commonly receive the ODT select signal ODTSEL. The ODT select signal ODTSEL includes impedance control signals RTT_WR, RTT_PARK, and RTT_NOM. The impedance control signal RTT_WR specifies a termination resistance value in a write operation, the impedance control signal RTT_PARK specifies a termination resistance value when the ODT control command ODTcont has a low level, and the impedance control signal RTT_NOM specifies a termination resistance value when the ODT control command ODTcont has a high level. The selection circuits 120 to 127 correspond to the data terminals 16-0 to 16-7, respectively. The selection circuits 128 and 129 correspond to the data strobe terminals 17a and 17b, respectively.

The data control circuit 100 further includes a latency counter 140 that delays the ODT control command ODTcont and the internal command signal ICMD by a predetermined latency. As shown in FIG. 3, the internal command signal ICMD includes a write signal Write activated in a write operation and a read signal Read activated in a read operation. The latency counter 140 delays the ODT control command ODTcont, the write signal Write, and the read signal Read by the number of clock cycles according to the set value MR in the mode register circuit 25 and outputs the delayed signals as an ODT control command ODTcontA, a write signal WriteA, and a read signal ReadA, respectively. The ODT control command ODTcontA, the write signal WriteA, and the read signal ReadA are supplied directly to the selection circuits 128 and 129 and supplied to the selection circuits 120 to 127 via a delay circuit 150.

As shown in FIG. 3, the internal read data Data0 to Data7 are supplied to the selection circuits 120 to 127, respectively, and internal data strobe signals IDQS and IDQSB are supplied to the selection circuits 128 and 129, respectively. Functions of the selection circuits 120 to 129 are explained later.

The data input/output circuit 200 includes output drivers 210 to 219 and input receivers 220 to 228. Among these elements, the output drivers 210 to 217 are connected to the data terminals 16-0 to 16-7, respectively, and the output drivers 218 and 219 are connected to the data strobe terminals 17a and 17b, respectively. The input receivers 220 to 227 are connected to the data terminals 16-0 to 16-7, respectively, and the input receiver 228 is connected to the data strobe terminals 17a and 17b. Accordingly, in a read operation, the output drivers 210 to 219 are activated so that the read data DQ0 to DQ7 based on the internal read data Data0 to Data7 are output from the data terminals 16-0 to 16-7, respectively, and the external data strobe signals DQS and DQSB are output from the data strobe terminals 17a and 17b, respectively. On the other hand, in a write operation, the write data DQ0 to DQ7 input from the data terminals 16-0 to 16-7 are supplied to the input receivers 220 to 227, respectively, so that the external data strobe signals DQS and DQSB input from the data strobe terminals 17a and 17b, respectively, are supplied to the input receiver 228.

The output drivers 210 to 219 are also activated in an ODT operation as well as in the read operation. Activation states of the output drivers 210 to 219 are specified by the corresponding selection circuits 120 to 129, respectively.

Figure 4:
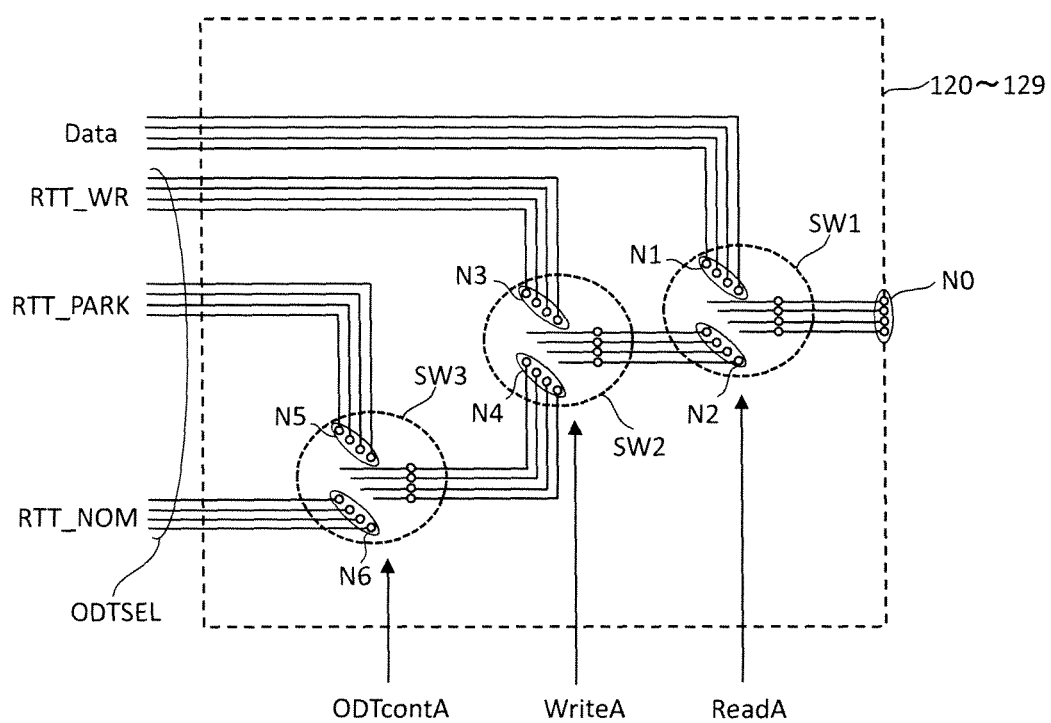
FIG. 4 is an image diagram for explaining a function of the selection circuits shown in FIG. 3.

Turning to FIG. 4, each of the selection circuits 120 to 129 includes three switches SW1 to SW3. The switches SW1 to SW3 have priorities, and the switch SW1 closest to an output node N0 has the highest priority and the switch SW3 farthest from the output node N0 has the lowest priority.

The switch SW1 connects either a node N1 or N2 to the output node N0 based on the read signal ReadA. Specifically, when the read signal ReadA is activated, the node N1 is selected and accordingly the corresponding internal read data Data is output from the output node N0. When the read signal ReadA is not activated, the node N2 is selected and accordingly a signal to be output from the output node N0 is determined by controls of the switches SW2 and SW3.

The switch SW2 connects either a node N3 or N4 to the node N2 of the switch SW1 based on the write signal WriteA. Specifically, when the write signal WriteA is activated, the node N3 is selected and accordingly the impedance control signal RTT_WR is output from the output node N0. When the write signal WriteA is not activated, the node N4 is selected and accordingly a signal to be output from the output node N0 is determined by a control of the switch SW3.

The switch SW3 connects either a node N5 or N6 to the node N4 of the switch SW2 based on the ODT control command ODTcontA. Specifically, when the ODT control command ODTcontA has a low level, the node N5 is selected and accordingly the impedance control signal RTT_PARK is output from the output node N0. When the ODT control command ODTcontA has a high level, the node N6 is selected and accordingly the impedance control signal RTT_NOM is output from the output node N0.

The output nodes N0 of the selection circuits 120 to 129 are connected to the corresponding output drivers 210 to 219, respectively. Accordingly, in a read operation, the output drivers 210 to 217 are controlled based on the internal read data Data0 to Data7 so that the read data DQ0 to DQ7 of a high or low level are output therefrom, respectively. The output drivers 218 and 219 are controlled based on the internal data strobe signals IDQS and IDQSB so that the complementary external data strobe signals DQS and DQSB are output, respectively. The external data strobe signals DQS and DQSB have the same frequency as that of the external clock signals CK and CKB.

Meanwhile, in states other than the read operation, the output drivers 210 to 219 function as termination resistors according to the ODT select signal ODTSEL. Specifically, in a write operation, output impedances of the output drivers 210 to 219 are controlled to have a value corresponding to the impedance control signal RTT_WR because the write signal WriteA is activated. In a period where neither a read operation nor a write operation is performed, the output impedances of the output drivers 210 to 219 are controlled to have a value corresponding to the impedance control signal RTT_PARK or a value corresponding to the impedance control signal RTT_NOM according to the ODT control command ODTcontA. Specific impedance values can be changed by the set value MR in the mode register circuit 25.

Referring back to FIG. 3, the input receivers 220 to 227 connected to the data terminals 16-0 to 16-7 are activated by a write strobe signal IDQSa. The write strobe signal IDQSa is obtained by driving the write strobe signal IDQS, which is output from the input receiver 228, and distributing the write strobe signal IDQS by means of a buffer circuit 230. Accordingly, after a predetermined delay time of the buffer circuit 230 has passed since the input receiver 228 activates the write strobe signal IDQS, the input receivers 220 to 227 are activated.

The delay circuit 150 included in the data control circuit 100 is a replica circuit of the input receiver 228 and the buffer circuit 230 included in the data input/output circuit 200. That is, a delay amount of the delay circuit 150 corresponds to a sum of a delay amount of the input receiver 228 and a delay amount of the buffer circuit 230. This indicates that a time lag until impedances of the output drivers 210 to 217 are switched by the operations of the selection circuits 120 to 127 after impedances of the output drivers 218 and 219 are switched by the operations of the selection circuits 128 and 129 is substantially equal to a time lag until the input receivers 220 to 227 are activated after the external data strobe signals DQS and DQSB are input to the data strobe terminals 17a and 17b. Symbols included in the delay circuit 150 are denoted by references 228R and 230R, which indicates that these are replica circuits of the input receiver 228 and the buffer circuit 230, respectively.

Configurations of the selection circuit 120 and the output driver 210 will be explained with reference to FIG. 5. The other selection circuits 121 to 129 and the other output drivers 211 to 219 have the same configurations.

Figure 5:
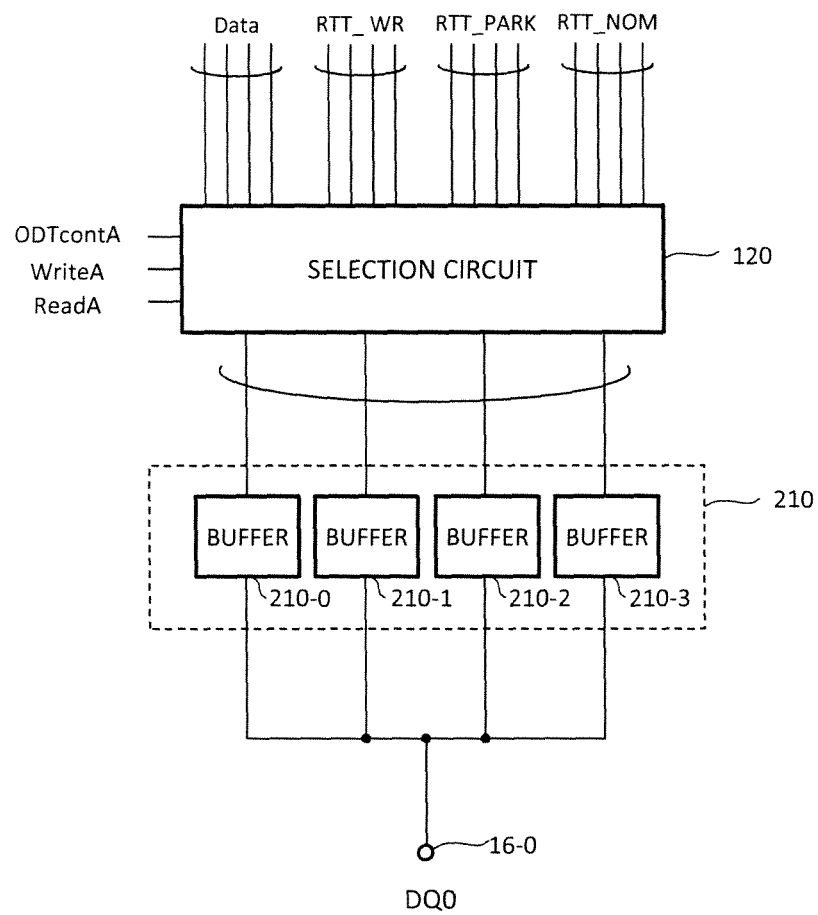
FIG. 5 is a block diagram more specifically showing the selection circuit and the output driver shown in FIG. 3.

As shown in FIG. 5, the output driver 210 has a plurality of buffers 210-0 to 210-3 arranged in parallel. The decoder 110 shown in FIG. 3 outputs the impedance control signals RTT_WR, RTT_PARK, or RTT_NOM corresponding to the buffers 210-0 to 210-3, respectively, to the selection circuit 120. The internal read data Data is composed of a plurality of signals corresponding to the buffers 210-0 to 210-3, respectively. In a read operation, the internal read data Data is selected by the selection circuit 120. The internal read data Data is then supplied to the buffers 210-0 to 210-3, so that all of the buffers 210-0 to 210-3 are activated and the data signals are output to the data terminal 16-0.

Meanwhile, when the output driver 210 functions as a termination resistor, a termination resistance value is controlled by the number of buffers to be activated. That is, when the output driver 210 functions as a termination resistor, the number of buffers to be activated is determined by one of the impedance control signals RTT_WR, RTT_PARK, and RTT_NOM, selected by the selection circuit 120 to determine the termination resistance value. The termination resistance value is controlled, for example, by activating three buffers when the impedance control signal RTT_WR is selected, activating two buffers when the impedance control signal RTT_PARK is selected, and activating one buffer when the impedance control signal RTT_NOM is selected. However, the number of buffers provided in the output driver 210 in the present invention is not limited to four and, for example, eight buffers can be arranged in parallel.

Figure 6:
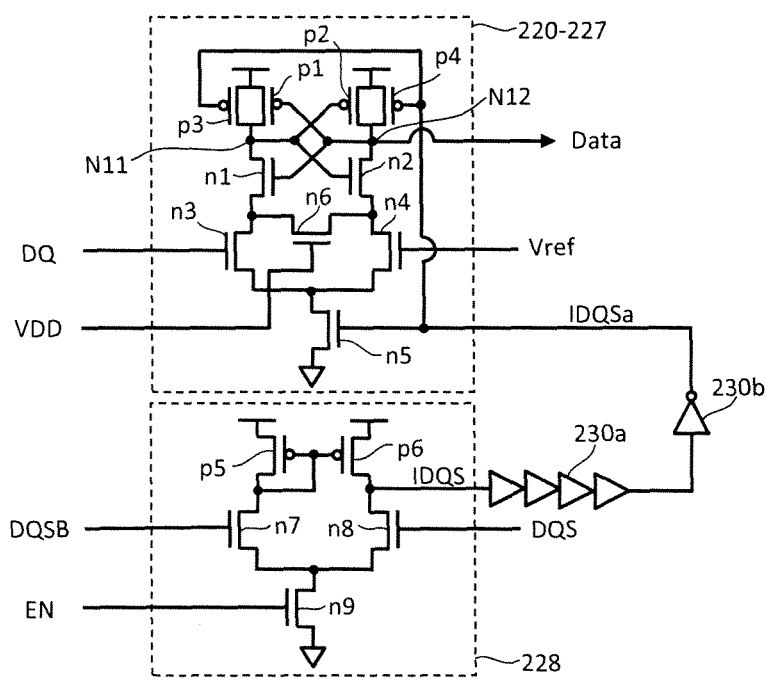
FIG. 6 is a circuit diagram of the input receivers shown in FIG. 3.

Turning to FIG. 6, the respective input receivers 220 to 227 are a differential amplifier with a latch circuit. The input receiver 228 is a normal differential amplifier. To specifically explain, each of the input receivers 220 to 227 includes P-channel MOS transistors p1 and p2 and N-channel MOS transistors n1 and n2 cross-coupled to nodes N11 and N12, respectively. That is, these transistors p1, p2, n1, and n2 constitute a flip-flop circuit so that different logic levels are held at the nodes N11 and N12, respectively. Latched write data Data is output from the node N12.

Sources of the transistors n1 and n2 are connected to drains of N-channel MOS transistors n3 and 4, respectively. The write data DQ0 to DQ7 are supplied through the corresponding data terminals 16-0 to 16-7 to gate electrodes of the transistors n3 of the input receivers 220 to 227, respectively. The reference voltage Vref is supplied to gate electrodes of the respective transistors n4. Sources of the transistors n3 and n4 are grounded via an N-channel MOS transistor n5.

Furthermore, each of the input receivers 220 to 227 includes P-channel MOS transistors p3 and p4 connected in parallel to the transistors p1 and p2, respectively. Sources of the transistors p1 to p4 are connected to the power supply potential VDD. An N-channel MOS transistor n6 is connected between the drain of the transistor n3 and the drain of the transistor n4. The power supply potential VDD is supplied to a gate electrode of the transistor n6.

Meanwhile, the input receiver 228 includes P-channel MOS transistors p5 and p6 having gate electrodes commonly connected, and N-channel MOS transistors n7 and n8 connected in series to the transistors p5 and p6, respectively. A drain of the transistor n7 is connected to the gate electrodes of the transistors p5 and p6. The write strobe signal IDQS is output from a drain of the transistor n8. Sources of the transistors n7 and n8 are grounded via an N-channel MOS transistor n9. An enable signal EN is supplied to a gate electrode of the transistor n9. The enable signal EN is activated according to a write command and is kept activated during a write operation.

The external data strobe signal DQSB is supplied to a gate electrode of the transistor n7 through the data strobe terminal 17b. Meanwhile, the external data strobe signal DQS is supplied to a gate electrode of the transistor n8 through the data strobe terminal 17a. Accordingly, when the external data strobe signals DQS and DQSB have a high level and a low level, respectively, the write strobe signal IDQS has a low level during a period where the enable signal EN has a high level. On the other hand, when the external data strobe signals DQS and DQSB have a low level and a high level, respectively, the write strobe signal IDQS has a high level during the period where the enable signal EN has a high level.

The write strobe signal IDQS generated in this way is supplied to gate electrodes of the transistors n5, p3, and p4 included in each of the input receivers 220 to 227 via a buffer circuit 230a and an inverter circuit 230b. Accordingly, when the write strobe signal IDQSa having passed through the buffer circuit 230 has a high level, the input receivers 220 to 227 are activated to compare the level of the corresponding one of the write data DQ0 to DQ7 with the reference voltage Vref and latch a comparison result. When the write strobe signal IDQSa having passed through the buffer circuit 230 has a low level, the transistors p3 and p4 are turned on and thus the write data DQ0 to DQ7 latched in the input receivers 220 to 227 are reset, respectively. When the enable signal EN is in an inactive state, the transistor n9 is in an off state and thus the transistors p5 and p6 function as resistive elements to raise the write strobe signal IDQS to a high level. Therefore, the write strobe signal IDQSa has a low level and the transistor n5 also enters an off state. Meanwhile, because the write strobe signal IDQSa has a low level, the transistors p3 and p4 enter an on state and thus the write data Data is fixed to a high level.

As described above, in the first embodiment, the input receivers 220 to 227 are controlled by the write strobe signal IDQSa having passed through the buffer circuit 230. Accordingly, a time difference Δt1 corresponding to the delay amounts of the input receiver 228 and the buffer circuit 230 needs to be set between an input timing of the external data strobe signals DQS and DQSB and an input timing of the write data DQ0 to DQ7. Because the time difference Δt1 is determined by the delay amounts of the input receiver 228 and the buffer circuit 230, it is independent of the frequency of the external clock signals CK and CKB.

Figure 7:
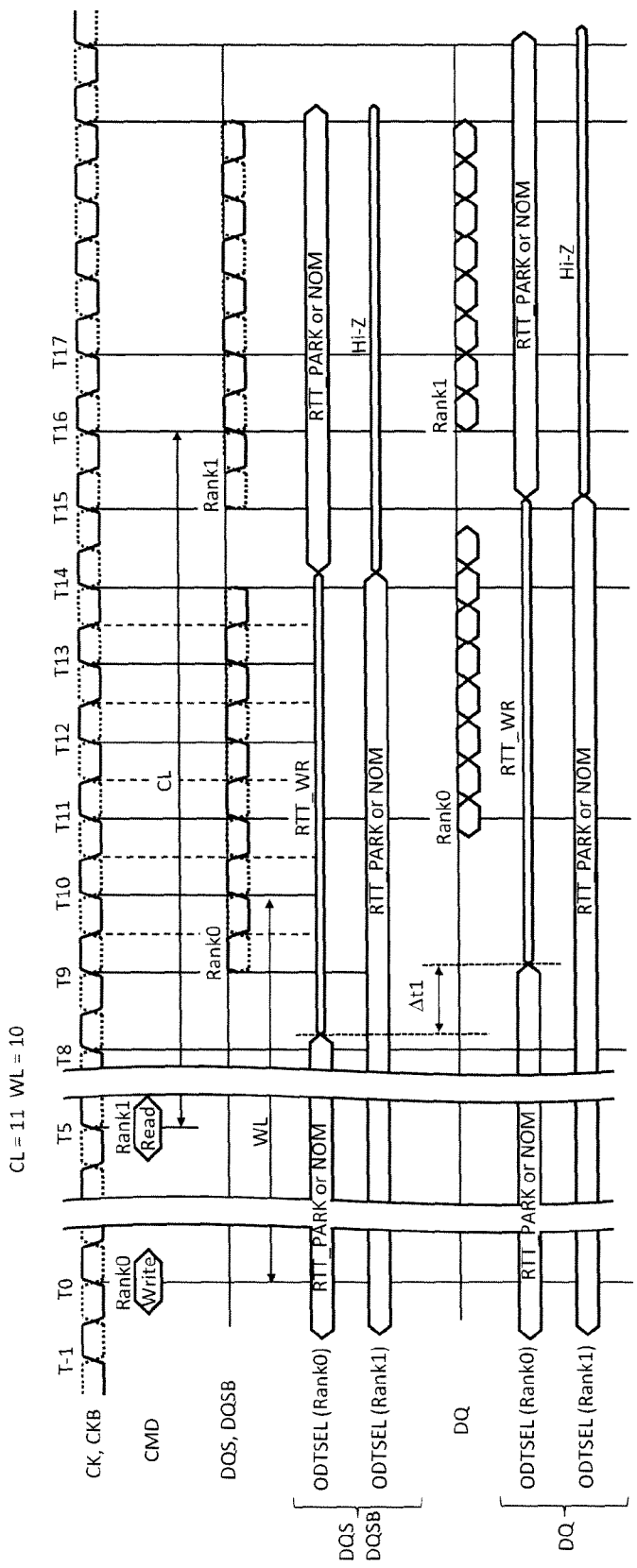
FIG. 7 is a timing chart for explaining an operation of the semiconductor device according to the first embodiment of the present invention.

The timing chart in FIG. 7 shows operations of two of the semiconductor devices 10 included in the memory module 50 shown in FIG. 2. These two semiconductor devices 10 belong to the ranks 0 and 1, respectively, and thus are accessed mutually exclusively. In an example shown in FIG. 7, a write command is issued to the semiconductor device 10 belonging to the rank 0 at a time T0 and a read command is issued to the semiconductor device 10 belonging to the rank 1 at a time T5. That is, FIG. 7 shows a write-to-read operation between different ranks.

In the present example, a write latency (WL) is set to 10 clock cycles and accordingly burst input of the write data DQ is started based on the external data strobe signals DQS and DQSB at a time T10. Practically, input of the external data strobe signals DQS and DQSB is started at a time T9, which is one clock cycle before the time T10. A period from the time T9 to the time T10 is a so-called preamble period. Because the write signal WriteA for the semiconductor device 10 belonging to the rank 0 is activated immediately before the time T9 when the input of the external data strobe signals DQS and DQSB is started (not shown), ODT operations of the output drivers 218 and 219 are switched correspondingly and output impedances thereof are switched from the value corresponding to the impedance control signal RTT_PARK or RTT_NOM to the value corresponding to the impedance control signal RTT_WR. The write signal WriteA for the semiconductor device 10 belonging to the rank 0 is kept activated until just after a time T14 when the input of the external data strobe signals DQS and DQSB ends.

In the first embodiment, the time difference Δt1 corresponding to the delay amounts of the input receiver 228 and the buffer circuit 230 needs to be set between the input timing of the external data strobe signals DQS and DQSB and the input timing of the write data DQ as explained with reference to FIG. 6. In the present example shown in FIG. 7, the time difference Δt1 corresponds to about one clock cycle and therefore input of the write data DQ is started not at the time T10 but at a time T11, which is one clock cycle delayed from the time T10. Similarly, switching of ODT operations of the output drivers 210 to 217 is performed the time difference Δt1, that is, about one clock cycle delayed from switching of ODT operations of the output drivers 218 and 219. Output impedances of the output drivers 210 to 217 are also switched from the value corresponding to the impedance control signal RTT_PARK or RTT_NOM to the value corresponding to the impedance control signal RTT_WR.

The input of the external data strobe signals DQS and DQSB ends at the time T14 and then the ODT operations of the output drivers 218 and 219 are also switched. In the present example shown in FIG. 7, output impedances thereof are switched from the value corresponding to the impedance control signal RTT_WR to the value corresponding to the impedance control signal RTT_PARK or RTT_NOM immediately after the time T14. At this point in time, the burst input of the write data DQ is still continued.

Last write data DQ is input at a timing when the time difference Δt1 has passed from the last external data strobe signals DQS and DQSB and then the ODT operations of the output drivers 210 to 217 are also switched. That is, the output impedances thereof are switched from the value corresponding to the impedance control signal RTT_WR to the value corresponding to the impedance control signal RTT_PARK or RTT_NOM. This is because the write signal WriteA that controls switching of the ODT operations is supplied to the selection circuits 120 to 127 via the delay circuit 150. As described above, in the first embodiment, the time difference Δt1 is set between the data strobe terminals 17*a* and 17*b* and the data terminals 16-0 to 16-7 also with respect to the switching timing of the ODT operations.

On the other hand, a read latency (CL) is set to 11 clock cycles in the present example shown in FIG. 7 and therefore burst output of the read data DQ from the semiconductor device 10 belonging to the rank 1 is started synchronously with the external data strobe signals DQS and DQSB at a time T16. Practically, output of the external data strobe signals DQS and DQSB is started at a time T15 one clock cycle before the time T16. In the first embodiment, output impedances of the output drivers 218 and 219 of the semiconductor device 10 belonging to the rank 1 are switched from the value corresponding to the impedance control signal RTT_PARK or RTT_NOM to Hi-Z immediately before the time T15 when the read signal ReadA is activated. Similarly, output impedances of the output drivers 210 to 217 of the semiconductor device 10 belonging to the rank 1 are switched from the value corresponding to the impedance control signal RTT_PARK or RTT_NOM to Hi-Z immediately before the time T16. Accordingly, ODT operations thereof are performed correctly. The read signal ReadA is kept activated until output of the external data strobe signals DQS and DQSB and the read data DQ is completed.

As described above, the ODT operations in the semiconductor device 10 according to the first embodiment are also switched with the time difference Δt1 and thus correct ODT operations can be performed.

Now, a prototype example that the inventors have conceived in the course of making the present invention will be explained with reference to FIGS. 8 to 10.

Figure 8:
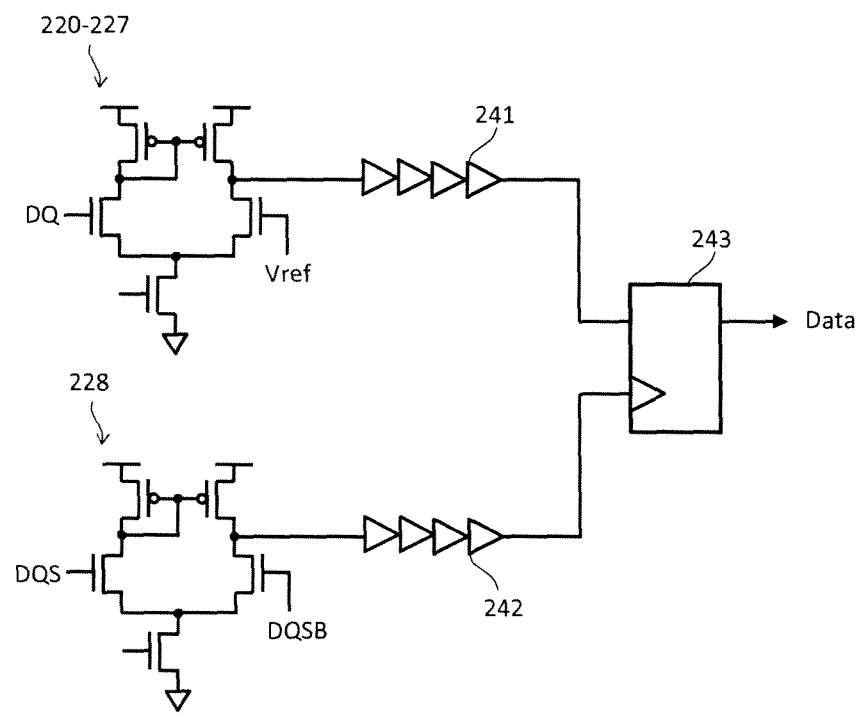
FIG. 8 is a circuit diagram of input receivers that the inventors have conceived as a prototype in the course of making the present invention.

The input receivers 220 to 228 shown in FIG. 8 have the same circuit configuration and are all normal differential amplifiers. An output signal from each of the input receivers 220 to 227 is supplied to an input node of a latch circuit 243 via a delay circuit 241 and an output signal from the input receiver 228 is supplied to a clock node of the latch circuit 243 via a buffer circuit 242. Delay amounts of the delay circuit 241 and the buffer circuit 242 are designed to be equal to each other. When the input receivers 220 to 228 having these circuit configurations are used, an input timing of the external data strobe signals DQS and DQSB and an input timing of the write data DQ0 to DQ7 match and thus no time difference needs to be set between switching timings of the ODT operations.

Figure 9:
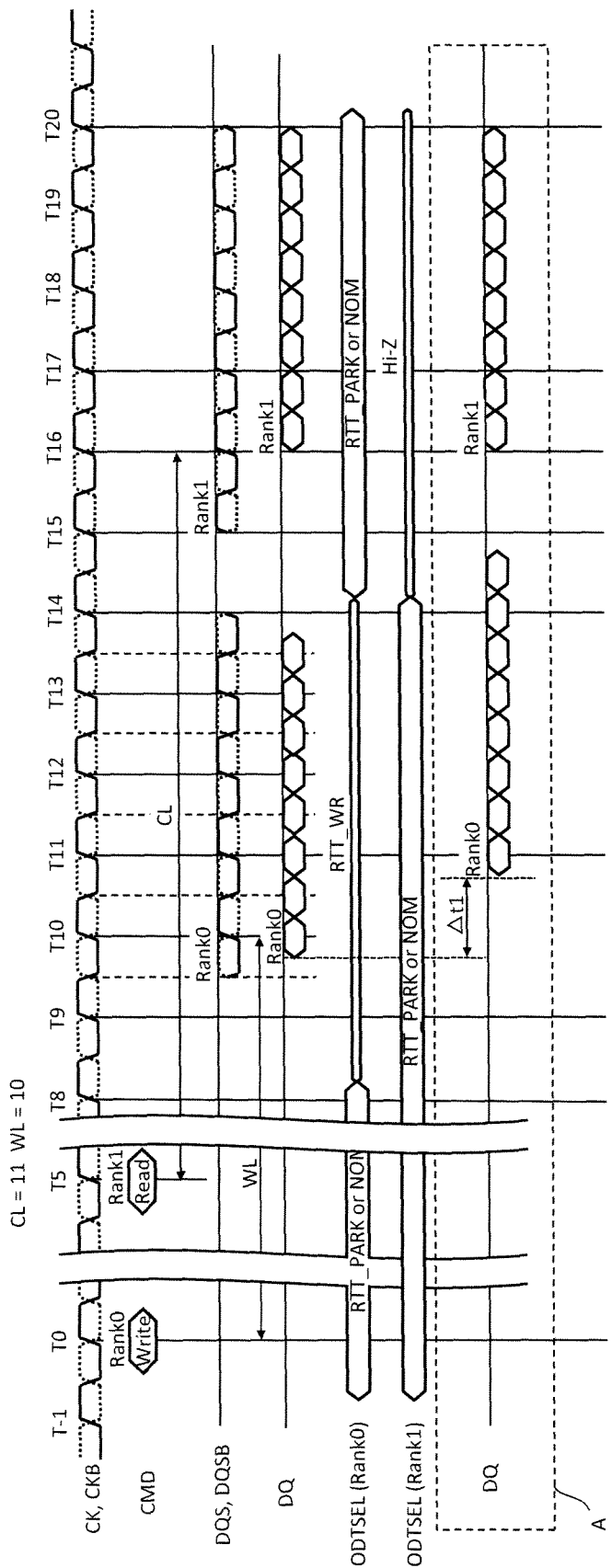
FIG. 9 is a timing chart showing an operation performed when the input receivers shown in FIG. 8 are used.

Turning to FIG. 9, when the input receivers 220 to 228 shown in FIG. 8 are used, the input timing of the external data strobe signals DQS and DQSB and the input timing of the write data DQ0 to DQ7 match and thus it suffices to switch the ODT operations of the output drivers 210 to 219 at the same time. In an example shown in FIG. 9, output impedances of the output drivers 210 to 219 are switched to the value corresponding to the impedance control signal RTT_WR immediately after a time T8 and the output impedances of the output drivers 210 to 219 are switched to the value corresponding to the impedance control signal RTT_PARK or RTT_NOM immediately after a time T14.

However, if the control mentioned above is applied as it is when the input receivers 220 to 228 shown in FIG. 6 are used, the ODT control cannot be performed correctly. That is, when the input receivers 220 to 228 shown in FIG. 6 are used, an input start timing of the write data DQ is delayed by the time difference Δt1 as compared to the case where the input receivers 220 to 228 shown in FIG. 9 are used and thus an input end timing of the write data DQ is also delayed by the time difference Δt1 as shown in a part enclosed by a broken line A in FIG. 9. Specifically, last write data DQ is input immediately before a time T15. When the write data DQ are supplied at this timing and if output impedances of the output drivers 210 to 219 are switched to the value corresponding to the impedance control signal RTT_PARK or RTT_NOM immediately after the time T14, the output impedances of the output drivers 210 to 217 are switched during burst input of the write data DQ and correct ODT operations cannot be performed.

Figure 10:
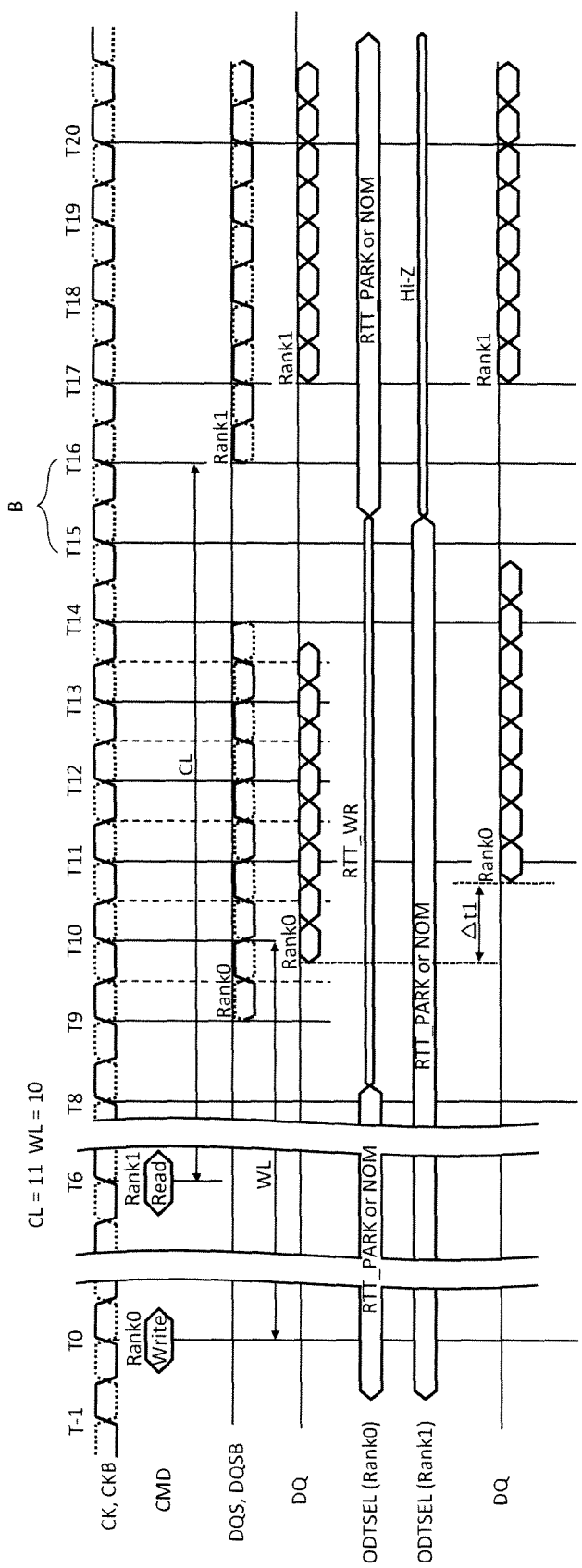
FIG. 10 is a timing chart for explaining an operation of the semiconductor device that the inventors have conceived as a prototype in the course of making the present invention.

This problem can be solved by delaying the timing when the output impedances of the output drivers 210 to 218 are switched to the value corresponding to the impedance control signal RTT_PARK or RTT_NOM by the time difference Δt1 or more as shown in FIG. 10. This prevents the output impedances of the output drivers 210 to 217 from being switched during burst input of the write data DQ and thus correct ODT operations can be performed. In this case, however, the timing when the next read operation is started also needs to be delayed by the time difference Δt1 or more, by one clock cycle in the present example, which decreases issuance efficiency of commands. In the example shown in FIG. 10, a write command is issued to the semiconductor device 10 belonging to the rank 0 at a time T0 and a read command is issued to the semiconductor device 10 belonging to the rank 1 at a time T6. That is, as compared to the example shown in FIG. 9, the issuance timing of a read command needs to be delayed by one clock cycle. Accordingly, a bubble period B is produced between a time T15 and a time T16 in the example shown in FIG. 10.

On the other hand, in the semiconductor device 10 according to the first embodiment mentioned above, the time difference $\Delta t1$ is set between the switching timing of the ODT operations for the output drivers 210 to 217 and the switching timing of the ODT operations for the output drivers 218 and 219 and thus correct ODT operations can be performed without decreasing the command issuance efficiency.

A second embodiment of the present invention is explained next.

A semiconductor device according to the second embodiment is characterized in the write leveling circuit 300 included in the data input/output circuit 200. The write leveling circuit performs a write leveling operation to adjust an input timing of the external data strobe signals DQS and DQSB in a write operation based on a timing when the external clock signals CK and CKB supplied from the controller reach the semiconductor device 10. The reason why such a control is required is that, because the external clock signals CK and CKB are commonly supplied to the plural semiconductor devices 10 in the memory module 50 as shown in FIG. 2, timings when the external clocks signals CK and CKB reach the semiconductor devices 10 vary according to mount positions thereof on the module substrate 51.

Figure 11:
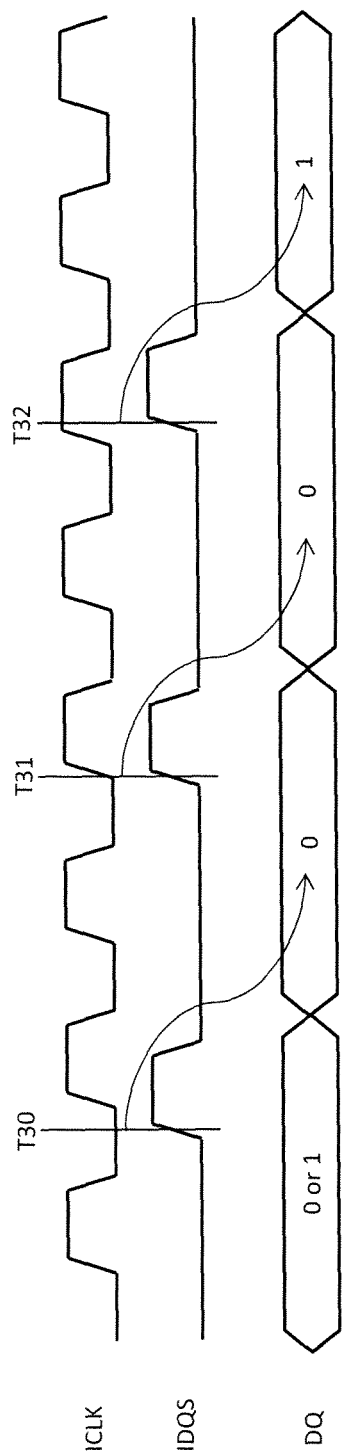
FIG. 11 is a timing chart for explaining a write leveling operation.

In an example shown in FIG. 11 for explaining a general write leveling operation, the internal clock signal ICLK has a low level at times T30 and T31 when a rising edge of the internal data strobe signal IDQS appears, and a leveling result DQ indicates a low level in this case. On the other hand, the internal clock signal ICLK has a high level at a time T32 when a rising edge of the internal data strobe signal IDQS appears and a leveling result DQ indicates a high level in this case. The leveling result is supplied to the controller via the corresponding one of the data terminals 16-0 to 16-7. Therefore, when the output timing of the external data strobe signals DQS and DQSB is moved little by little to be off the output timing of the external clock signals CK and CKB, the leveling result DQ is inverted with a boundary of a state where phases thereof match. Accordingly, the controller stores therein a timing difference at inversion of the leveling result DQ and supplies the external data strobe signals DQS and DQSB at a timing based on the stored timing difference during a write operation.

Figure 12:
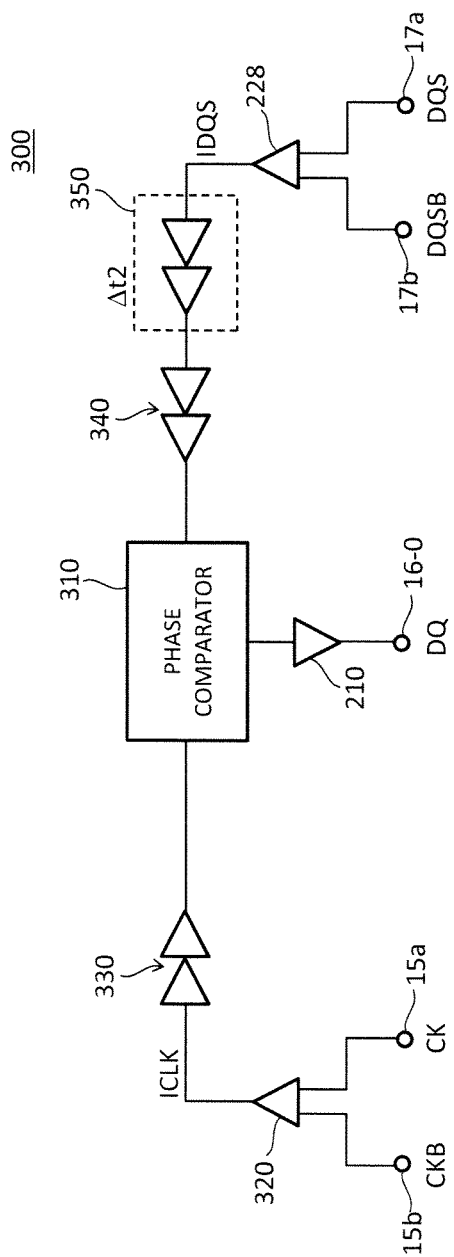
FIG. 12 is a circuit diagram of the write leveling circuit according to a second embodiment of the present invention.

Turning to FIG. 12, the write leveling circuit 300 includes a phase comparator 310 that compares phases of the internal clock signal ICLK and the internal data strobe signal IDQS. An operation of the phase comparator 310 is as explained with reference to FIG. 11. The internal clock signal ICLK is generated by the clock input circuit 320 based on the complementary external clock signals CK and CKB supplied through the clock terminals 15a and 15b, respectively. Meanwhile, the internal data strobe signal IDQS is generated by the input receiver 228 based on the complementary external data strobe signals DQS and DQSB supplied through the data strobe terminals 17a and 17b, respectively.

The internal clock signal ICLK output from the clock input circuit 320 is supplied to the phase comparator 310 with a predetermined delay produced by passing through several buffer circuits 330. Meanwhile, the internal data strobe signal IDQS output from the input receiver 228 is supplied to the phase comparator 310 after passing through several buffer circuits 340 and also passing through a delay circuit 350.

Accordingly, when a timing when the external clock signals CK and CKB are supplied and a timing when the external data strobe signals DQS and DQSB are supplied are the same, a timing when the internal data strobe signal IDQS reaches the phase comparator 310 is delayed from a timing when the internal clock signal ICLK reaches the phase comparator 310 by a time difference $\Delta t2$ corresponding to an amount of delay of the delay circuit 350.

This means that the phase comparator 310 detects a phase match when the timing when the external data strobe signals DQS and DQSB are supplied is earlier than the timing when the external clock signals CK and CKB are supplied for the time difference $\Delta t2$. That is, when the write leveling circuit 300 shown in FIG. 12 is used, a leveling operation completes in a state where the input timing of the external data strobe signals DQS and DQSB is earlier than the input timing of the external clock signals CK and CKB for the time difference $\Delta t2$.

An effect of the second embodiment of the present invention is explained with reference to FIG. 13.

Figure 13:
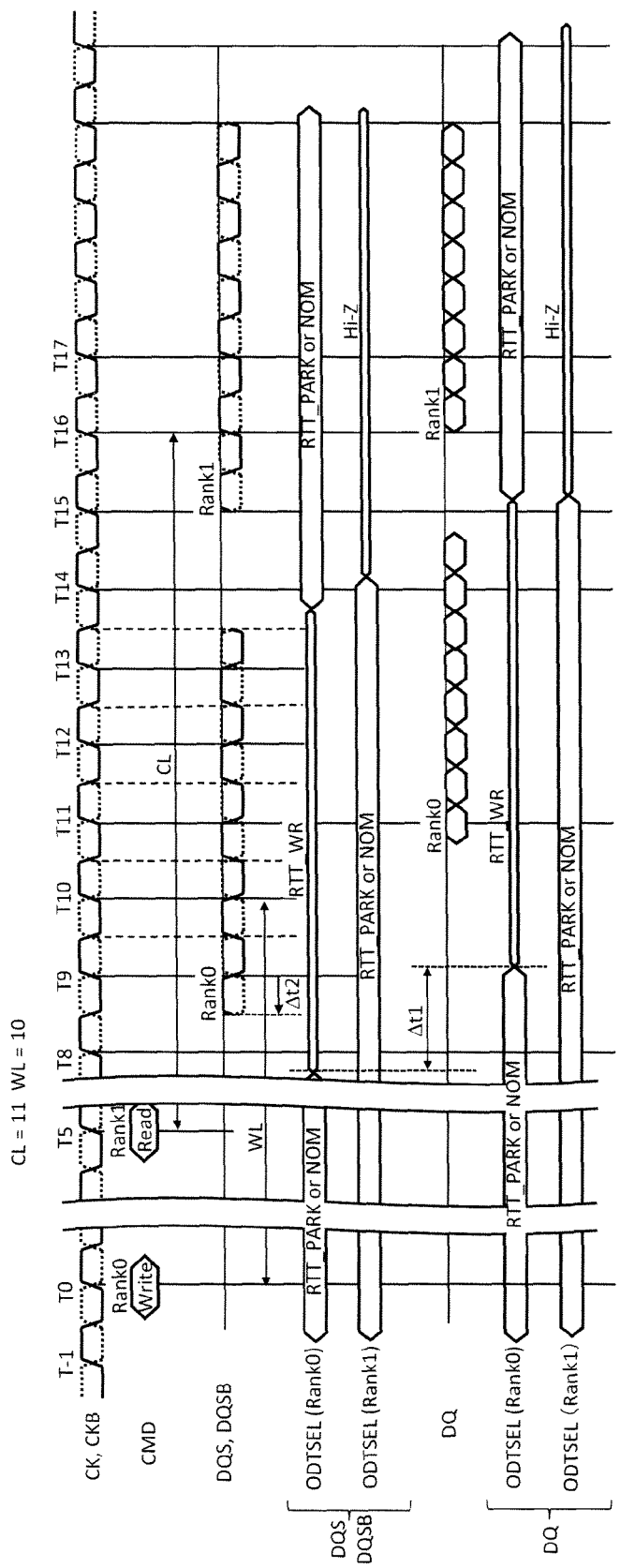
FIG. 13 is a timing chart for explaining an effect of the second embodiment of the present invention.

An operation shown in FIG. 13 is basically the same as that explained with reference to FIG. 7; however, it is different in that the frequency of the external clock signals CK and CKB is increased by about half. As already explained, the time difference $\Delta t1$ obtained by the buffer circuit 230 is independent of the frequency of the external clock signals CK and CKB and thus the time difference $\Delta t1$ becomes relatively longer than the clock cycle when the frequency of the external clock signals CK and CKB is increased. Because the frequency of the external clock signals CK and CKB is increased by about half in the present example shown in FIG. 13, the time difference $\Delta t1$ corresponds to about 1.5 clock cycle. That is, a time difference of about 1.5 clock cycle needs to be set between the input timing of the external data strobe signals DQS and DQSB and the input timing of the write data DQ.

This necessity means that a write-to-read operation becomes difficult when the frequency of the external clock signals CK and CKB is increased. This is because a period between an input end timing of the write data DQ and an output start timing of the next write data DQ is shortened as the frequency of the external clock signals CK and CKB is increased. Although a period equal to or longer than one clock cycle is practically required between the input end timing of the write data DQ and the output start timing of the read data DQ, the period equal to or longer than one clock cycle cannot be ensured therebetween when the frequency of the external clock signals CK and CKB is equal to or higher than a predetermined value.

However, because the input timing of the external data strobe signals DQS and DQSB is offset by the time difference $\Delta t2$ in the second embodiment, the input timing of the external data strobe signals DQS and DQSB and the input timing of the write data DQ are wholly advanced by the time difference $\Delta t2$ in a write operation. As a result, in the example shown in FIG. 13, the input start timing of the write data DQ can be set to a time T11 as in the example shown in FIG. 7 and the write-to-read operation can be correctly performed.

According to the present invention, even when reception timings of a data signal and a data strobe signal are offset during a write operation, values of the termination resistors are not changed during reception of the data signal. Furthermore, start of the next write operation or read operation does not need to be delayed and thus access efficiency is not decreased.

It is apparent that the present invention is not limited to the above embodiments, but may be modified and changed without departing from the scope and spirit of the invention.

What is claimed is:

1. A device comprising:
   a data strobe terminal;
   a data terminal;
   a first output driver coupled to the data strobe terminal;
   a second output driver coupled to the data terminal; and
   a data control circuit configured to enable the first and second output drivers to function as termination resistors in different timings from each other.

2. The device as claimed in claim 1, wherein the data control circuit is configured to enable the first output driver to function as a termination resistor and then to enable the second output driver to function as a termination resistor.

3. The device as claimed in claim 2, wherein the data control circuit responds to at least one of an ODT control command and a write command to enable the first and second output drivers to function as termination resistors.

4. The device as claimed in claim 2, wherein
   the data control circuit supplies an internal data signal to the second output driver in response to a read command, and
   the second output driver drives the data terminal to a high level or a low level based on the internal data signal.

5. The device as claimed in claim 2, further comprising a first input receiver coupled to the data strobe terminal and a second input receiver coupled to the data terminal.

6. The device as claimed in claim 5, wherein the second input receiver is activated after a predetermined delay time has passed since an external data strobe signal is supplied to the first input receiver.

7. The device as claimed in claim 6, wherein the data control circuit enables the second output driver to function as a termination resistor after the predetermined delay time has passed since the data control circuit enables the first output driver to function as a termination resistor.

8. The device as claimed in claim 6, further comprising:
   a clock terminal supplied with an external clock signal; and
   a write leveling circuit configured to detect a difference between a timing when the external data strobe signal is supplied to the data strobe terminal and a timing when the external clock signal is supplied to the clock terminal.

9. The device as claimed in claim 8, wherein the write leveling circuit is configured to detect whether a timing when the external data strobe signal is supplied to the data strobe terminal is earlier than a timing when the external clock signal is supplied to the clock terminal for a predetermined time.

10. The device as claimed in claim 8, wherein the predetermined delay time is free from a clock cycle of the external clock signal.

11. A device comprising:
    a data strobe terminal;
    a data terminal;
    a first output driver coupled to the data strobe terminal;
    a first input receiver coupled to the data strobe terminal;
    a second output driver coupled to the data terminal; and
    a second input receiver coupled to the data terminal, wherein
    the second input receiver is activated after a predetermined delay time has passed since an external data strobe signal is supplied to the first input receiver through the data strobe terminal, and
    an output impedance of the second output driver changes from a first value to a second value after the predetermined delay time has passed since an output impedance of the first output driver changes from the first value to the second value.

12. The device as claimed in claim 11, wherein
    the first input receiver receives the external data strobe signal through the data strobe terminal during a period in which an output impedance of the first output driver has the second value, and
    the second input receiver receives a data signal through the data terminal during a period in which an output impedance of the second output driver has the second value.

13. The device as claimed in claim 11, wherein an output impedance of the second output driver changes from the second value to the first value after the predetermined delay time has passed since an output impedance of the first output driver changes from the second value to the first value.

14. The device as claimed in claim 11, further comprising a clock terminal supplied with an external clock signal having substantially the same frequency as that of the external data strobe signal,
    wherein the predetermined delay time is free from the frequency of the external clock signal.

15. A device comprising:
    a first selection circuit receiving first information and second information and outputting a selected one of the first and second information in response to a first selection signal;
    a delay circuit delaying the first selection signal to produce a second selection signal;
    a second selection circuit receiving third information and fourth information and outputting a selected one of the third and fourth information in response to the second selection signal;
    a first circuit responding to the selected one of the first and second information; and
    a second circuit responding to the selected one of the first and second information.

16. The device as claimed in claim 15, wherein the first information comprises a data strobe signal, the second information comprising a first impedance designation signal, the third information comprising a data signal, and the fourth information comprising a second impedance designation signal.

17. The device as claimed in claim 16, wherein the selected one of the third and fourth information comprises the data signal when the selected one of the first and second information comprises the data strobe signal, and the selected one of the third and fourth information comprises the first impedance designation signal when the selected one of the first and second information comprises the second impedance designation signal.

18. The device as claimed in claim 17,
    wherein the device further comprises a first terminal coupled to the first circuit and a second terminal coupled to the second circuit;
    wherein the first circuit drives the first terminal in response to the data strobe signal when the selected one of the first and second information comprises the data strobe signal and is brought into a first impedance state in response to the first impedance designation signal when the selected one of the first and second information comprises the first impedance designation signal; and
    wherein the second circuit drives the second terminal in response to the data signal when the selected one of the third and fourth information comprises the data signal and is brought into a second impedance state in response to the second impedance designation signal when the selected one of the first and second information comprises the second impedance designation signal.

19. The device as claimed in claim 18,
wherein the device further comprises:
a third circuit coupled to the first terminal, the third circuit configured to receive an additional data strobe signal from the first terminal and produce a control signal in response thereto; and
a fourth circuit coupled to the second terminal, the fourth circuit being configured to receive an additional data signal from the second terminal and fetch the additional data signal in response to the control signal.

20. The device as claimed in claim 19, wherein the delay circuit is approximately equal in delay time to the third circuit.

* * * * *